Dec. 10, 1968 SHOICHI NAKAMURA 3,416,094

AUTOMATIC GAIN CONTROL SYSTEM

Filed Feb. 21, 1966

INVENTOR.
SHOICHI NAKAMURA
BY
Ward, Haselton, McElhannon, Orme, Brooks & Fitzpatrick
ATTORNEYS United States Patent Office 3,416,094

Patented Dec. 10, 1968

3,416,094

AUTOMATIC GAIN CONTROL SYSTEM

Shoichi Nakamura, Tokyo, Japan, assignor to Sony Corporation, Tokyo, Japan, a corporation of Japan Filed Feb. 21, 1966, Ser. No. 528,993
Claims priority, application Japan, Feb. 24, 1965, 40/10,532
6 Claims. (Cl. 330—28)

ABSTRACT OF THE DISCLOSURE

An automatic gain control system is provided which accomplishes the automatic gain control function by simultaneously controlling at least both the impedance for shunting the signal and the negative feedback so that the range of signal control is wide and signal distortion is unlikely to occur, whereby the said automatic gain control system is especially well suited for use in recording amplifiers of tape recorders inasmuch as no volume control is required.

This invention relates to an automatic gain control system, and in particular to an automatic gain control system of the type employing semiconductor devices such as transistors.

In prior automatic gain control (AGC) systems, output gain was controlled by the provision of variable impedance elements arranged to shunt signals passing through the system. Variable negative feedback circuits have also been used to effect automatic gain control. These techniques however are limited by a narrow output gain and accordingly distortions where liable to occur at the output. According to the present invention, automatic gain control is accomplished by simultaneously controlling at least both the impedance for shunting the signal and the negative feedback so that the range ot the control is wide and the distortion is unlikely to occur. The automatic gain control system of this invention is thus especially well suited for use in recording amplifiers of tape recorders inasmuch as no volume control is required.

Accordingly, it is an object of this invention to provide an automatic gain control system which operates effectively over a wide range and which minimizes output distortion.

It is another object of this invention to provide an automatic gain control system which includes a transistor for shunt and negative feedback.

It is another object of this invention to provide an automatic gain control system which is the most suitable for use in the amplifier of tape recorders.

Figure 1:
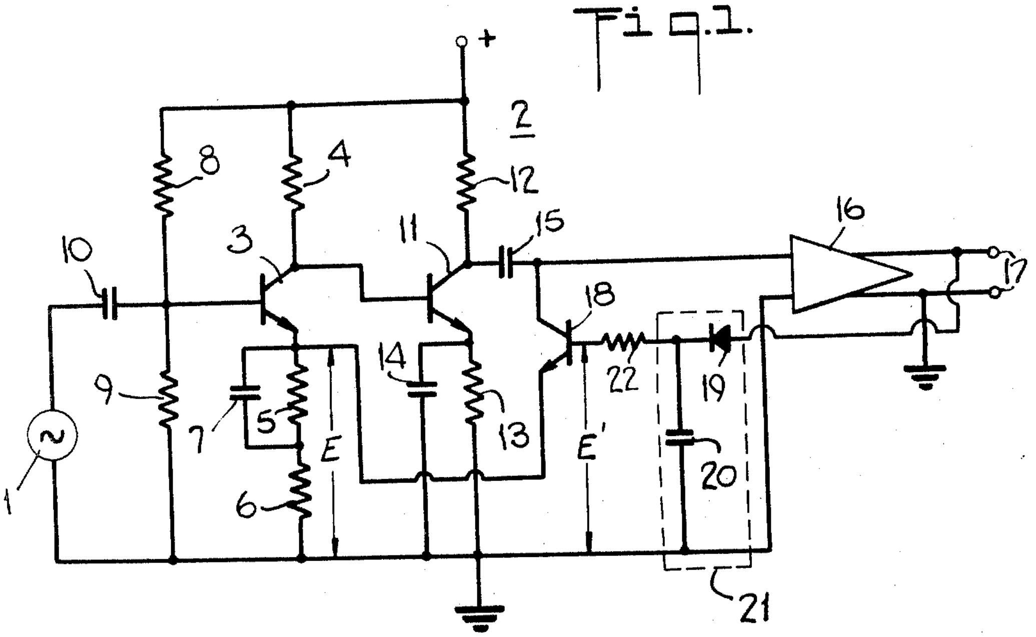
Figure 2:
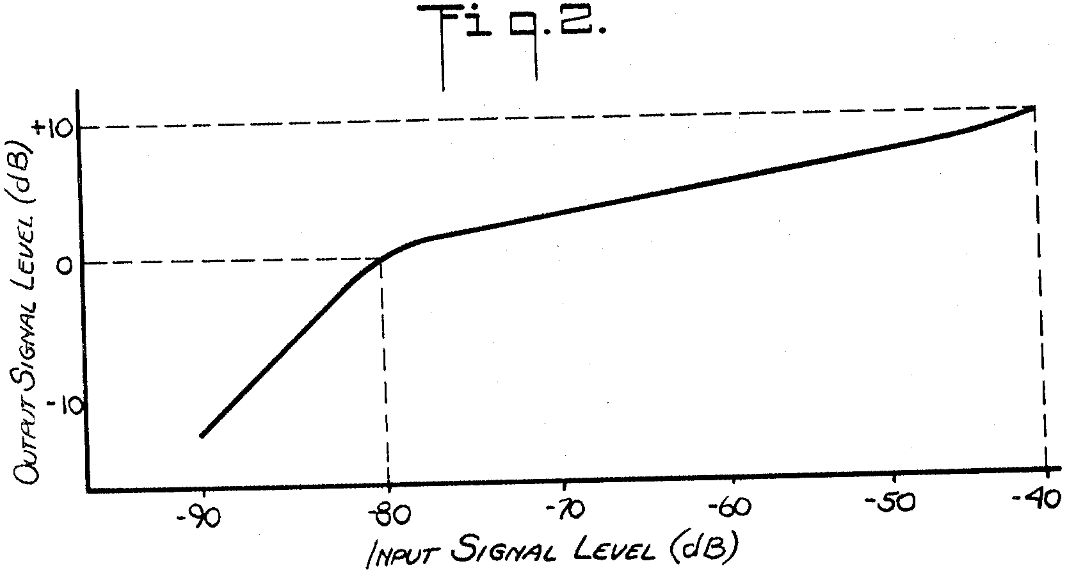

Other objects, features and advantages of this invention will become apparent from the following description taken in conjunction with the accompanying drawings, in which:

FIG. 1 is a circuit diagram illustrating one embodiment of the present invention, such embodiment comprising an automatic gain control circuit for a transistor amplifier; and FIG. 2 is a graph showing an input-output characteristic curve, for explaining the circuit illustrated in FIG. 1.

With reference to the drawings, one example of this invention will hereinafter be described in detail. As shown in FIG. 1, a signal source 1 is connected to a two-stage transistor amplifier 2 of the grounded emitter type. The transistor amplifier 2 includes a first stage transistor 3 having connected thereto a collector resistor 4, a pair of series connected emitter resistors 5 and 6, a by-pass capacitor 7 and a pair of base resistors 8 and 9. Signals are supplied to the base terminal of the transistor 3 from the signal source 1 through a coupling capacitor 10. There is also provided a second stage transistor 11, having connected thereto a collector resistor 12, an emitter resistor 13 and a by-pass capacitor 14. The base terminal of the second stage transistor 11 is connected directly to the collector terminal of the first stage transistor 3. The collector terminal of the second stage transistor 11 is coupled to an amplifier 16 through a coupling capacitor 15. The amplifier 16 is provided with a pair of output terminals 17.

According to this invention, the collector of the transistor 11 is connected through the coupling capacitor 15 to the collector of a further transistor 18 which serves as a variable impedance element. The emitter terminal of the transistor 18 is connected to the emitter terminal of the first stage transistor 3, or to the connection point between the resistors 5 and 6, constituting a negative feedback loop.

In order to control the impedance of the transistor 18 with the AGC output of the amplifier 16, one of the output terminals 17 is connected to a detector circuit 21. This circuit includes a diode 19 and a capacitor 20 to obtain the AGC output across the capacitor 20. This output is applied through a resistor 22 to the base terminal of the transistor 18 as desired.

It has been found that when the values $R_E$ and $R_L$ of the resistors 6 and 12 respectively, are selected to be such that $R_L > 10R_E$, and when $R_E < 200$ to 300 ohms, the gain of the amplifier 2 can be varied considerably in response to variations in the impedance of the transistor 18. In this case, it is advantageous to select the output impedance of the amplifier 16 such that it is considerably lower than the input impedance of the detector circuit 21. This avoids distortion of the output signal which otherwise might result due to the connection of the detector circuit 21. Further, the base and emitter potentials E' and E of the transistor 18 are made to be nearly equal to each other when the input signal level has reached a predetermined value.

With such an arrangement, there is obtained at the output terminal 17, by the AGC voltage in the detector circuit 21, an output signal level which is substantially in proportion to the input signal level before the input signal level reaches a condition in which the base and emitter potentials E' and E of the transistor 18 become nearly equal to each other. When the base potential E' exceeds the emitter potential E due to the AGC voltage, the potential difference therebetween is applied as a bias voltage to the transistor 18, causing a decrease in the impedance between the collector and emitter of the transistor 18. As a result of this, the signal output voltage from the transistor 11 is divided by the transistor 18 and the resistor 6 and applied to the transistor 3 as a negative feedback voltage. Thus, the gain of the amplifier circuit 2 becomes effectively decreased as the negative feedback voltage is increased with decreasing impedance of transistor 18. As a result, the output signal level becomes stabilized at a level where the base potential of the transistor 18 is slightly greater than its emitter potential. Further, when the impedance of the transistor 18 greatly lowers to be smaller than the value $R_L$ of the resistor 12, the output of the transistor 11 is shunted and the gain is correspondingly further reduced. Thus, the output level of the amplifier is equalized over a wide range. It should be noted that since the impedance of the transistor 18 is changed by the AGC output to shunt the signal and at the same time the negative feedback signal is applied to the transistor 3, very wide-range control can be accomplished.

According to my experiments in which the resistors 6 and 12 were 150 ohms and 2.7K ohms respectively, and use was made of a Sony 2SC402 as the transistor 18, the input-output level characteristic was as illustrated in FIG.

2. It has been found that the output level may respond to variations in the input level over a range of 50 db. In the graph of FIG. 2, the relatively sharply sloped portion of the low input signal level is within a range in which the influence of the internal impedance of the system is small for all practical purposes, and/or the output level has not yet reached a predetermined value. As shown by the gently sloped upper portion, the negative feedback is effective at the higher signal levels above the predetermined value.

As is apparent from the graph of FIG. 2, the automatic gain control system of this invention makes possible an amplifier circuit in which distortion is effectively eliminated in the output due to the feedback effect.

It will be apparent that many modifications and variations may be effected without departing from the scope of the novel concepts of the invention.

I claim:

1. An automatic gain control system comprising a multistage amplifier, another amplifier connected to the output of said multistage amplifier, a transistor having three terminals connected with the collector, emitter and base thereof, means connecting one of said terminals with the output of the last stage of said multistage amplifier to shunt the output of the latter through the impedance of said transistor between said one terminal and another of said terminals thereof, said impedance being varied in dependence upon signals applied to the third of said terminals, negative feedback means for said multistage amplifier having said variable impedance of the transistor interposed therein to increase a negative feedback voltage applied to said multistage amplifier for decreasing the gain thereof with decreasing values of said impedance, and means connected between said third terminal of the transistor and the output of said further amplifier to control said impedance of the transistor in dependence on said output of the further amplifier whereby automatic gain control is achieved by the combination of shunting the output of the multistage amplifier and negative feedback thereto so as to be effective over a wide range.

2. An automatic gain control system according to claim 1, wherein said means to control the impedance of the transistor comprises a detector circuit.

3. An automatic gain control system comprising a transistorized multistage amplifier of the grounded emitter type, a further amplifier connected to the output of said multistage amplifier, a control transistor, the collector of said control transistor being connected to the collector of the last stage transistor of said multistage amplifier, the emitter of said control transistor being connected to an emitter resistance of a transistor in said multistage amplifier in a configuration to constitute a voltage divider for a negative feedback voltage by the impedance of said control transistor between the collector and emitter thereof and by said emitter resistance, and control means connected between the base of said control transistor and the output of said further amplifier to control said impedance in dependence on said output of the further amplifier, whereby automatic gain control is achieved by the combination of negative feedback and shunting of the output of said multistage amplifier through said impedance so as to be effective over a wide range.

4. An automatic gain control circuit as in claim 3 wherein successive stages of said multistage amplifier include respectively an emitter connected resistor in the first stage and a collector connected resistor in the second stage, said collector connected resistor having a resistance value at least ten times as great as that of the emitter connected resistor.

5. An automatic gain control circuit as in claim 4 wherein the emitter of said control transistor is connected to said emitter connected resistor in the first stage.

6. An automatic gain control circuit as in claim 4 wherein said emitter connected resistor has a resistance value less than 300 ohms.

References Cited

UNITED STATES PATENTS

| | | | |
|---|---|---|---|
| 2,903,522 | 8/1959 | Flower | 330—28 |
| 3,019,396 | 1/1962 | Heine et al. | 330—29 X |
| 3,098,199 | 7/1963 | Carney et al. | 330—29 |

FOREIGN PATENTS

| | | |
|---|---|---|
| 625,308 | 8/1961 | Canada. |
| 652,157 | 11/1962 | Canada. |
| 193,076 | 12/1964 | Sweden. |

ROY LAKE, *Primary Examiner.*

JAMES B. MULLINS, *Assistant Examiner.*

U.S. Cl. X.R.

330—29, 85, 86